United States Patent
Ju

(10) Patent No.: US 7,168,960 B1
(45) Date of Patent: Jan. 30, 2007

(54) CONNECTING MECHANISM

(75) Inventor: Ted Ju, Keelung (TW)

(73) Assignee: Lotes Co., Inc., Keelung (TW)

( * ) Notice: Subject to any disclaimer, the term of this patent is extended or adjusted under 35 U.S.C. 154(b) by 0 days.

(21) Appl. No.: 11/349,229

(22) Filed: Feb. 8, 2006

(51) Int. Cl.
  *H01R 12/00* (2006.01)
  *H05K 1/00* (2006.01)
(52) U.S. Cl. ........................ 439/67; 439/495
(58) Field of Classification Search .......... 439/67, 439/495, 493, 260
  See application file for complete search history.

(56) References Cited

U.S. PATENT DOCUMENTS 5,911,597 A * 6/1999 Oshitani .............. 439/495

FOREIGN PATENT DOCUMENTS

| CN | 02129941.2 | 8/2002 |
| CN | 02252145.3 | 8/2002 |

\* cited by examiner

*Primary Examiner*—Javaid H. Nasri
(74) *Attorney, Agent, or Firm*—Troxell Law Offices, PLLC

(57) ABSTRACT

A connecting mechanism, designed for attaching a sheet-like conducting cable with an upper and down insulating films sandwiching a conducting core consisting a plurality of wires onto a conducting pad on a computer circuit board, comprises a retaining structure having an upper cover and two sidewalls that define a receptacle space, a clipping piece capable of being inserted into the interior of the retaining structure, a reinforcing plate connected to the sheet-like conducting cable and a flexible plastic piece housed within the reinforcing plate between the clipping piece and the wire for providing a uniform clipping force over the wire, whereby the sheet-like conducting cable can be electrically connected to the conducting pad on the computer board.

12 Claims, 3 Drawing Sheets

CONNECTING MECHANISM

BACKGROUND OF THE INVENTION (a) Field of the Invention

The present invention relates to connecting mechanisms, more particularly to a connecting mechanism for fixing a flexible wire to a personal computer main board.

(b) Description of the Prior Art

A connecting mechanism that fixes a flexible wire to a personal computer main board of the prior art is either a clipping device directly soldered on to a computer main board or an assisting piece directly soldered onto a computer main board that can fix a clipping device onto the computer main board, whereby the clipping device will be fully contained within the assisting piece. As disclosed by P.R.O.C. patent number 02129941.2, a clipping device is soldered onto a solder plate of a personal computer circuit board. On side of the clipping device is pulled open so that a flexible wire sheet can be disposed between the personal computer circuit board and the clipping device, whereby the closure of the side of the clipping device will fix the flexible wire sheet onto the board. However, after repetitious opening and clipping, the flexible wire will be deformed permanently, and fractures will be formed where the permanent deformations appear. As disclosed by P.R.O.C. patent number 02252145, a bracket is soldered onto a solder plate of a personal computer circuit board. A flexible wire sheet is then placed beneath the bracket and then clipped between the computer circuit board and a confining piece of a clipping device. To withdraw the flexible wire sheet, the confining pieces of the clipping device will be taken out of the bracket first, which is very inconvenient. Further, since the clipping device is applied onto the wire sheet, it cannot hold the wire sheet tightly.

Therefore, it is necessary to invent a new connecting mechanism aiming at overcoming the above faults.

SUMMARY OF THE INVENTION

The primary objective of the present invention is to provide a connecting mechanism for effectively connecting an electronic element to a computer main board, which is easy to operate.

To achieve the above objective, the connecting mechanism aims to fix a sheet-like conducting cable to a computer board, which conducting cable comprises an upper and down insulating films that sandwich the conducting portion of the wire. The sheet-like conducting cable further includes a conducting portion at one terminal thereof, which is exposed out of the insulating films. The computer board is provided with a conducting pad corresponding to the conducting portion. The connecting mechanism comprises a retaining structure having an upper cover and two sidewalls, which define a receptacle space, a clipping piece capable of being inserted into the interior of the retaining structure, a reinforcing plate connected to the sheet-like conducting cable and a flexible plastic piece housed within the reinforcing plate between the clipping piece and the wire for providing a uniform clipping force over the wire, whereby the sheet-like conducting cable can be electrically connected to the conducting pad on the computer board.

Compared with the current technologies, a connecting mechanism of the present invention assures more effective connection between an electronic element and a computer board. Further, the present invention is easy to operate.

The various objects and advantages of the present invention will be more readily understood from the following detailed description when read in conjunction with the appended drawings.

DETAILED DESCRIPTION OF THE PREFERRED EMBODIMENTS

Figure 1:
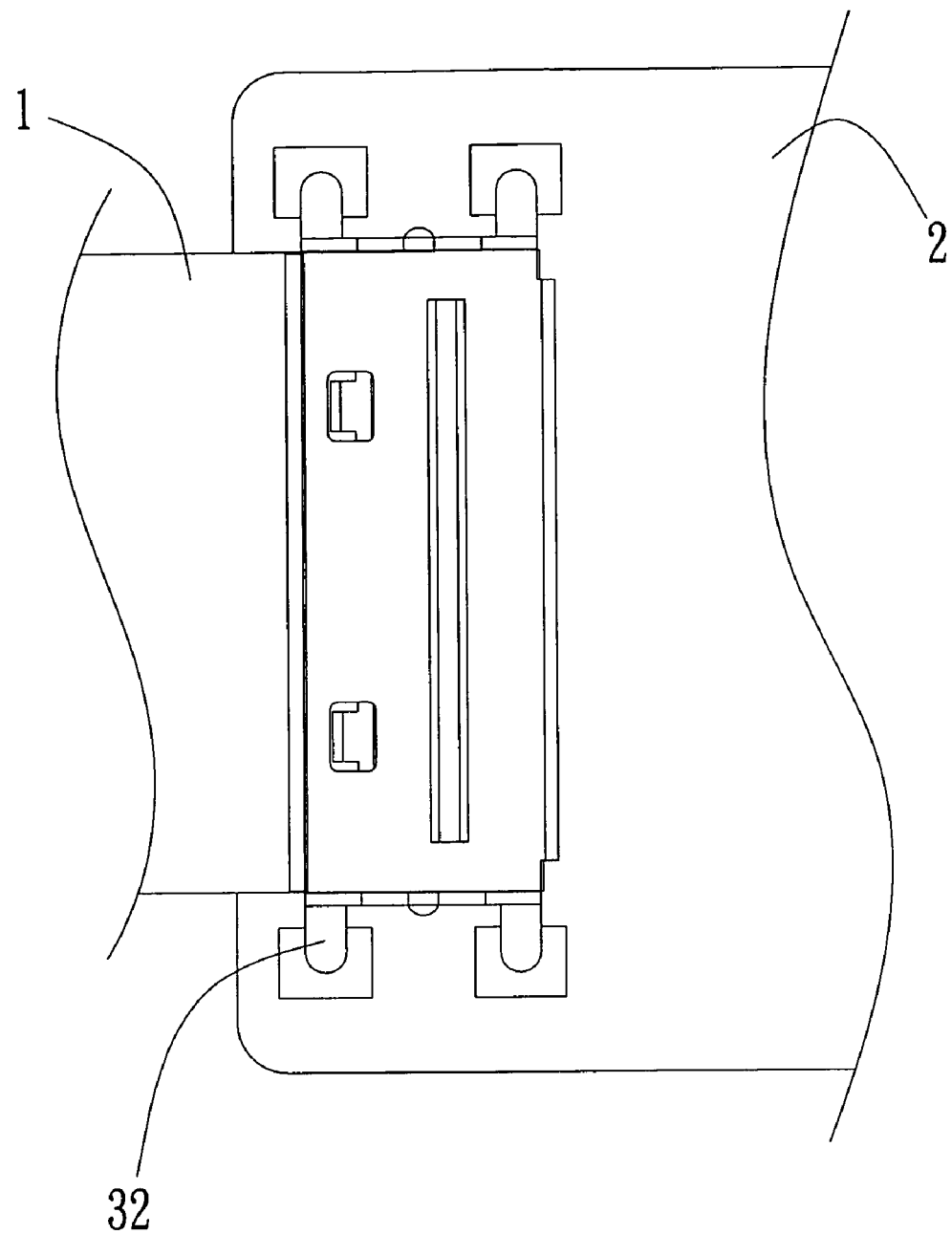
FIG. 1 shows the connection between a sheet-like conducting cable having a plurality of wires and a computer board.
Figure 2:
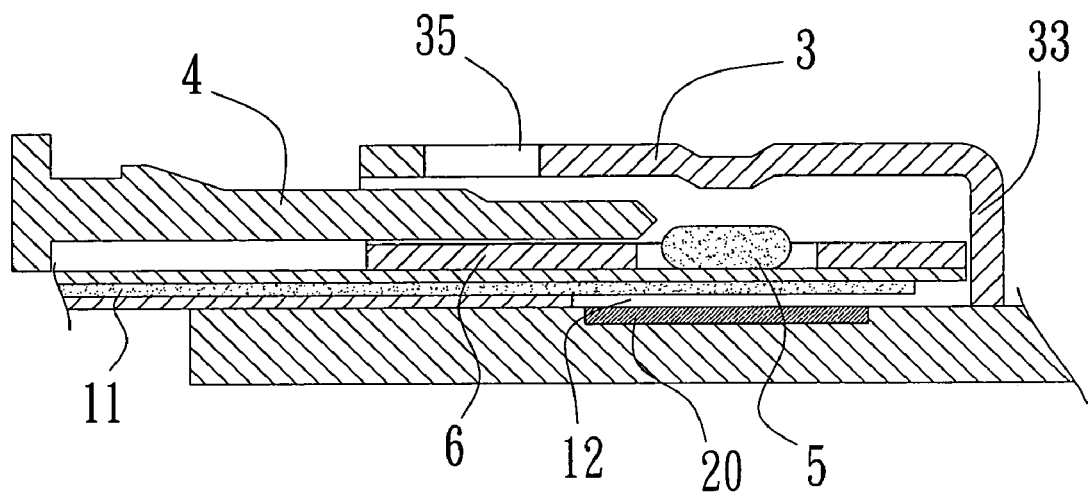
FIG. 2 is a side cross-sectional view of the connecting mechanism of the present invention before a clipping piece is inserted.
Figure 3:
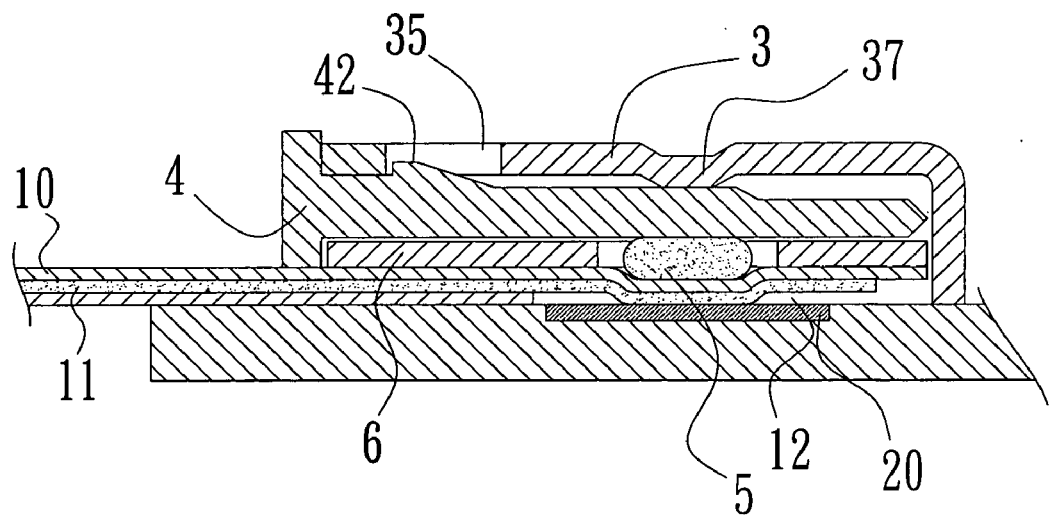
FIG. 3 is a side cross-sectional view of the connecting mechanism of the present invention after a clipping piece is inserted.
Figure 4:
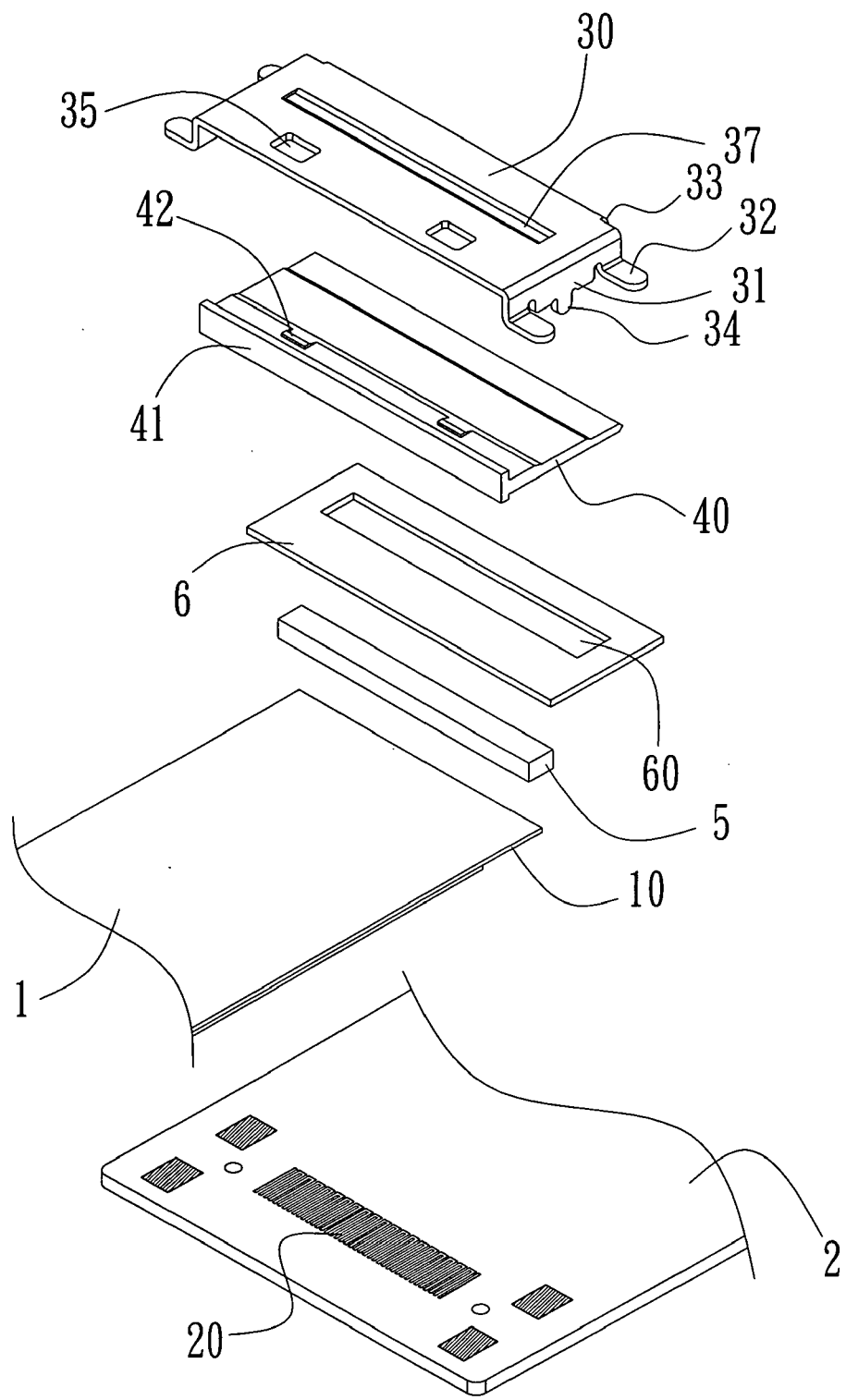
FIG. 4 is an exploded perspective view of the connecting mechanism in FIG. 1.

Referring to FIGS. 1 to 4, a connecting mechanism according to the present invention is for fixing an electronic element 1, which is a sheet-like conducting cable with a plurality of wires in this preferred embodiment, onto a computer board 2. The conducting cable 1 further comprises a parallel pair of insulating films 10 and a set of core wires 11 sandwiched by the insulating films 10. It further includes a contact area 12 where the core wires 11 are exposed to the exterior. The surface of the computer board 2 is provided with a conducting pad 20 corresponding to contact area 12, and therefore the conducting cable 1 can be attached onto the computer board 2 through the electrical contact between the contact area 12 and the conducting pad 20. The connecting mechanism comprises a retaining structure 3, a clipping piece 4 capable of being inserted into the interior of the retaining structure 3 for fixing the conducting cable 1, whereby the conducting cable 1 can be electrically connected to the computer board 2, a reinforcing plate 6 provided with a receptacle hole 60 and a flexible plastic piece 5 housed within the receptacle hole 60 for uniformly clipping the conducting cable 1, whereby the contact area 12 of the conducting cable 1 will be connected with the conducting pad 20 on the computer board 2.

The retaining structure 3, being fixed on the computer board 2, is formed by on piece of metal through punching and further comprises an upper cover 30 and a pair of sidewalls 31 extended downward from two lateral sides of the upper cover 30. The flexible plastic piece 5 is disposed between the upper side and the lower side, whereby the upper cover 30 of the retaining structure 3 will pinch the flexible plastic piece 5. The inner space between the sidewalls 31 and the upper cover 30 defines a receptacle space. There is a folded foot 32 extended from the free end of each of the sidewalls 31 so that the retaining structure 3 can be soldered onto the computer board 2 more easily. Further, the width of the retaining structure 3 defined by the sidewalls 31 is slightly larger than the width of the retaining structure 3, thereby the retaining structure 3 can retain the sheet-like conducting cable 1. There is further a block wall 33 formed at the rear end of the retaining structure 3, a pair of retaining portions 34 extended downward from respective sidewalls 31 and going through the computer board 2. There is a locking hole 35 formed on the upper cover 30 for securing the inserted clipping piece 4. There is further a downward projected rib portion 37 for tilting the inserted clipping piece 4 downward to the flexible plastic piece 5.

The clipping piece 4 further includes a slab portion 40 and a terminal flange 41 for confining the electronic element so that it will not fall off from retaining structure 3. Therefore, the height of the terminal flange 41 is greater than the thickness of the slab portion 40. As the slab portion 40 is being inserted into the retaining structure 3, the terminal flange 41 is always left outside the retaining structure 3. The purpose of the terminal flange 41 is blocking the ejection of the flexible plastic piece 5 from the retaining structure 3 so as to preventing a departure of the conducting cable 1 from the retaining structure 3. The clipping piece 4 further includes a pair of projected retaining pieces 42 that engage the locking hole 35 and therefore lock the clipping piece 4 firmly inside the retaining structure 3.

To fix the conducting cable 1 on the computer board 2, the retaining structure 3 is firstly soldered onto the computer board 2, and then the conducting cable 1 and the clipping piece 4 is inserted between the sidewalls 31 of the retaining structure 3 in order. As the clipping piece 4 is being inserted, it will tilted downward by the rib portion 37 within the retaining structure 3 so that the flexible plastic piece 5 thereon will uniformly press the conducting cable 1, thereby attaining an electrical connection between the conducting cable 1 and the conducting pad 20 on the computer board 2.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A connecting mechanism, designed for attaching a sheet-like conducting cable with an upper and down insulating films sandwiching a conducting core consisting a plurality of wires onto a conducting pad on a computer circuit board, comprising:
    a retaining structure having an upper cover and two sidewalls, said upper cover and said sidewalls defining a receptacle space;
    a clipping piece capable of being inserted into said receptacle space of said retaining structure;
    a reinforcing plate capable of being connected to said sheet-like conducting cable; and
    a flexible plastic piece housed within said reinforcing plate and sandwiched by said clipping piece and said sheet-like conducting cable for providing a uniform clipping force over said sheet-like conducting cable, whereby said sheet-like conducting cable can be electrically connected to said conducting pad on said computer circuit board.

2. The connecting mechanism of claim 1 wherein said flexible plastic piece is fixed by said clipping piece.

3. The connecting mechanism of claim 1 wherein said flexible plastic piece is pressed onto said sheet-like conducting cable.

4. The connecting mechanism of claim 1 wherein said upper cover of said retaining structure supports against said clipping piece for pressing said flexible plastic piece, when said clipping piece is being inserted between said sidewalls of said retaining structure; thereby, said flexible plastic piece attaining a uniform clipping effect, and said sheet-like conducting cable being electrically connected to said conducting pad on said computer board.

5. The connecting mechanism of claim 1 wherein said sidewalls of said retaining structure retain said sheet-like conducting cable.

6. The connecting mechanism of claim 1 wherein said retaining structure further comprises downwardly projected rib portions on an inner wall of said upper cover for tilting said clipping piece downward to press said flexible plastic piece so as to achieve a uniform clipping effect over said wires on said conducting cable and an electrical connection between said conducting cable and said conducting pad on said computer board.

7. The connecting mechanism of claim 1 wherein said upper cover further comprises a locking hole for securing said clipping piece.

8. The connecting mechanism of claim 1 wherein said retaining structure further includes outwardly extended feet for facilitating said retaining structure being soldered onto said computer board.

9. The connecting mechanism of claim 1 wherein said retaining structure further includes downwardly extended retaining portions that run through said computer board.

10. The connecting mechanism of claim 1 wherein said clipping piece further comprises a slab portion and a terminal flange with a height greater than the thickness of said slab portion; as the slab portion is being inserted into said retaining structure, said terminal flange being always left outside said retaining structure.

11. The connecting mechanism of claim 7 wherein a top side of said clipping piece further includes a pair of projected retaining pieces that will be engaged with said locking hole and therefore lock said clipping piece firmly inside said retaining structure.

12. The connecting mechanism of claim 1 wherein said clipping piece further comprises a slab portion and a terminal flange for holding said sheet-like conducting cable and preventing said sheet-like conducting cable from falling off.

* * * * *